US009466663B2

(12) United States Patent
Hsu et al.

(10) Patent No.: US 9,466,663 B2
(45) Date of Patent: Oct. 11, 2016

(54) SEMICONDUCTOR ARRANGEMENT HAVING CAPACITOR SEPARATED FROM ACTIVE REGION (71) Applicant: Taiwan Semiconductor Manufacturing Company Limited, Hsin-Chu (TW)

(72) Inventors: Chern-Yow Hsu, Chu-Bei (TW); Shih-Chang Liu, Alian Township (TW); Chia-Shiung Tsai, Hsin-Chu (TW); Xiaomeng Chen, Hsinchu (TW); Chen-Jong Wang, Hsin-Chu (TW)

(73) Assignee: Taiwan Semiconductor Manufacturing Company Limited, Hsin-Chu (TW)

( * ) Notice: Subject to any disclaimer, the term of this patent is extended or adjusted under 35 U.S.C. 154(b) by 47 days.

(21) Appl. No.: 14/063,312

(22) Filed: Oct. 25, 2013

(65) Prior Publication Data
US 2015/0115409 A1  Apr. 30, 2015

(51) Int. Cl.
*H01L 49/02* (2006.01)
*H01L 27/108* (2006.01)

(52) U.S. Cl.
CPC ......... *H01L 28/90* (2013.01); *H01L 27/10814* (2013.01); *H01L 27/10852* (2013.01); *H01L 27/10894* (2013.01)

(58) Field of Classification Search
CPC ............... H01L 27/10852; H01L 23/5223; H01L 27/0629; H01L 27/10814; H01L 27/10855

USPC ........ 257/301, 303, 306, E21.648, 296, 308, 257/E27.016, E27.088, E27.092, 298, 516, 257/532; 438/243, 244, 253, 386
See application file for complete search history.

(56) References Cited

U.S. PATENT DOCUMENTS

| 6,794,694 B2 | 9/2004 | Diodato et al. |
| 2003/0085420 A1* | 5/2003 | Ito et al. .................. 257/309 |
| 2012/0329236 A1* | 12/2012 | Ueda .............................. 438/381 |
| 2013/0034957 A1* | 2/2013 | Miyata ......................... 438/637 |
| 2013/0052785 A1* | 2/2013 | Mashiko et al. .............. 438/381 |

FOREIGN PATENT DOCUMENTS

JP       2012064627       3/2012

OTHER PUBLICATIONS

Corresponding Korean Application, Korean Office action dated Sep. 21, 2015, 14 pages.

* cited by examiner

*Primary Examiner* — David Vu
*Assistant Examiner* — Jonathan Han
(74) *Attorney, Agent, or Firm* — Cooper Legal Group, LLC (57) ABSTRACT

A semiconductor arrangement includes an active region including a semiconductor device. The semiconductor arrangement includes a capacitor having a first electrode layer, a second electrode layer, and an insulating layer between the first electrode layer and the second electrode layer. At least three dielectric layers are between a bottom surface of the capacitor and the active region.

20 Claims, 14 Drawing Sheets

SEMICONDUCTOR ARRANGEMENT HAVING CAPACITOR SEPARATED FROM ACTIVE REGION

BACKGROUND

Capacitors are useful to, among other things, store electrical charge within circuits.

DESCRIPTION OF THE DRAWINGS

Aspects of the disclosure are understood from the following detailed description when read with the accompanying drawings. It will be appreciated that elements and/or structures of the drawings are not necessarily be drawn to scale. Accordingly, the dimensions of the various features may be arbitrarily increased and/or reduced for clarity of discussion.

DETAILED DESCRIPTION

The claimed subject matter is now described with reference to the drawings, wherein like reference numerals are generally used to refer to like elements throughout. In the following description, for purposes of explanation, numerous specific details are set forth in order to provide an understanding of the claimed subject matter. It is evident, however, that the claimed subject matter may be practiced without these specific details. In other instances, structures and devices are illustrated in block diagram form in order to facilitate describing the claimed subject matter.

One or more techniques for forming a semiconductor arrangement and resulting structures formed thereby are provided herein.

Figure 1:
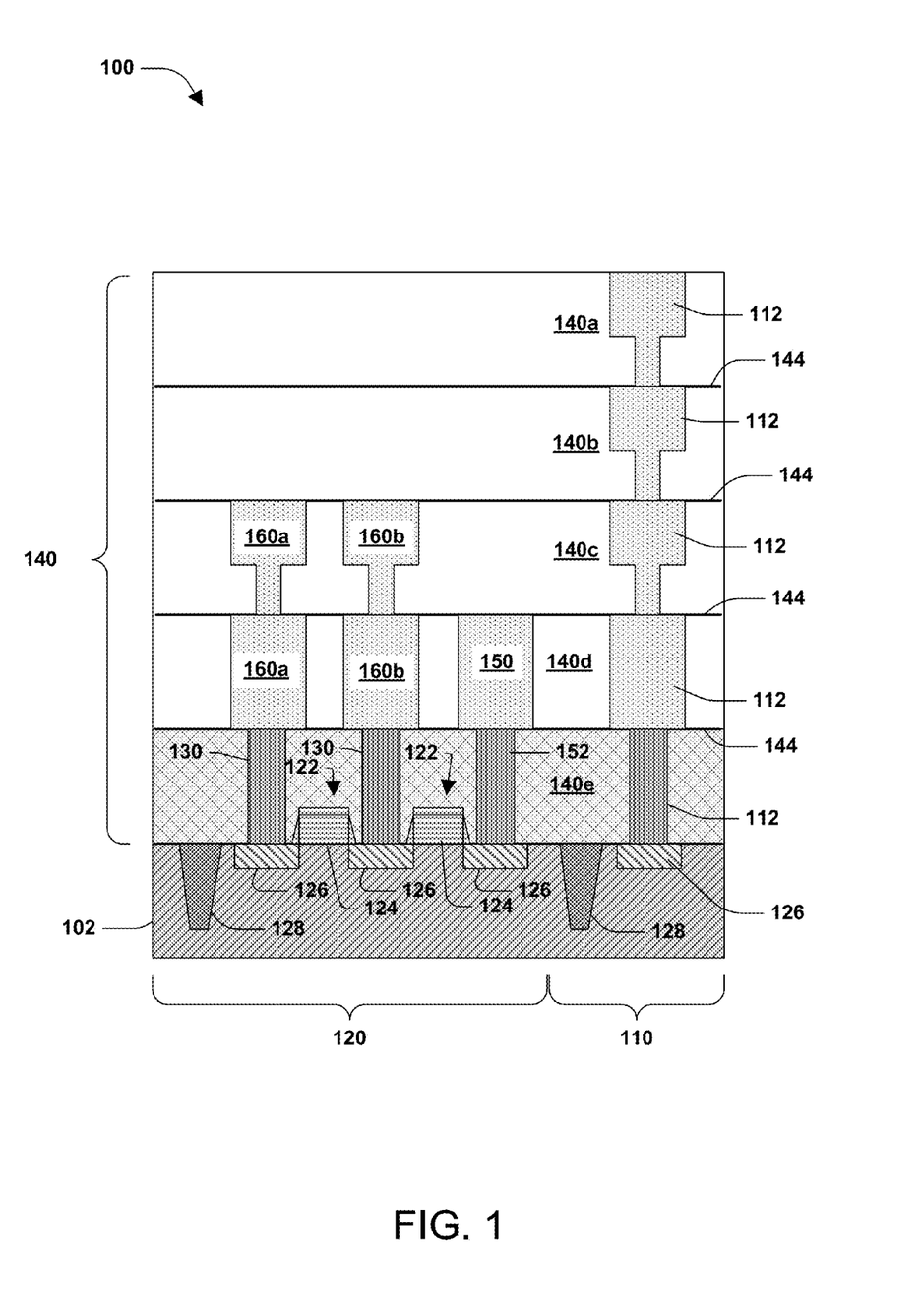
FIG. 1 illustrates a portion of a semiconductor arrangement, according to an embodiment.

FIG. 1 is a perspective view illustrating a portion of a semiconductor arrangement 100 according to some embodiments. In an embodiment, the semiconductor arrangement 100 is formed upon a substrate region 102. The substrate region 102 comprises any number of materials, such as, for example, silicon, polysilicon, germanium, etc., alone or in combination. According to some embodiments, the substrate region 102 comprises an epitaxial layer, a silicon-on-insulator (SOI) structure, a wafer, or a die formed from a wafer, etc.

According to some embodiments, the semiconductor arrangement 100 comprises a logic region 110 and an active region 120. In an embodiment, the logic region 110 is formed on or within the substrate region 102. In some embodiments, the logic region 110 comprises one or more logic contacts 112 that are electrically connected within the logic region 110. The logic contacts 112 are formed in any number of ways, such as by a single damascene process, dual damascene process, etc.

According to some embodiments, the active region 120 comprises one or more DRAM cells (not shown). In an embodiment, the active region 120 is formed on or within the substrate region 102. In some embodiments, the active region 120 comprises a semiconductor device 122 formed on or within the substrate region 102. In some embodiments, the semiconductor device 122 comprises a gate region 124, a source/drain region 126, etc. In an embodiment, one or more STI regions 128 are formed within the substrate region 102. In some embodiments, the active region 120 comprises one or more contacts 130 that are electrically connected to the source/drain regions 126.

In some embodiments, the semiconductor arrangement 100 comprises one or more dielectric layers 140 formed over the substrate region 102 and the semiconductor device 122. According to some embodiments, the one or more dielectric layers 140 comprise a first dielectric layer 140a, a second dielectric layer 140b, a third dielectric layer 140c, a fourth dielectric layer 140d, and a fifth dielectric layer 140e, although any number of dielectric layers are contemplated. In some embodiments, at least one of the dielectric layers 140 comprises a standard dielectric material with a medium or low dielectric constant, such as $SiO_2$. In some embodiments, the dielectric layers 140 comprise a dielectric material with a relatively high dielectric constant. The dielectric layers 140 are formed in any number of ways, such as by thermal growth, chemical growth, atomic layer deposition (ALD), chemical vapor deposition (CVD), plasma-enhanced chemical vapor deposition (PECVD), etc.

In some embodiments, the semiconductor arrangement 100 comprises one or more etch stop layers 144 separating the dielectric layers 140. In some embodiments, the etch stop layers 144 stop an etching process between the dielectric layers 140. According to some embodiments, the etch stop layers 144 comprise a dielectric material having a different etch selectivity from the dielectric layers 140. In some embodiments, at least one of the etch stop layers 144 comprises SiN, SiCN, SiCO, CN, etc., alone or in combination. The etch stop layers 144 are formed in any number of ways, such as by thermal growth, chemical growth, atomic layer deposition (ALD), chemical vapor deposition (CVD), plasma-enhanced chemical vapor deposition (PECVD), etc.

In some embodiments, the semiconductor arrangement 100 comprises a bit line 150. In an embodiment, the bit line 150 extends through the fourth dielectric layer 140d. According to some embodiments, the bit line 150 comprises a metal material and is connected to the source/drain region 126 through a contact 152.

In some embodiments, the semiconductor arrangement 100 comprises one or more metal contacts 160. In an embodiment, the metal contacts 160 extend through the third dielectric layer 140c or the fourth dielectric layer 140d. In some embodiments, the metal contacts 160 comprise first metal contacts 160a and second metal contacts 160b. The metal contacts 160 are formed in any number of ways, such as by a single damascene process, dual damascene process, etc. In some embodiments, the metal contacts 160 are connected to the source/drain regions 126 through the contacts 130.

Figure 2:
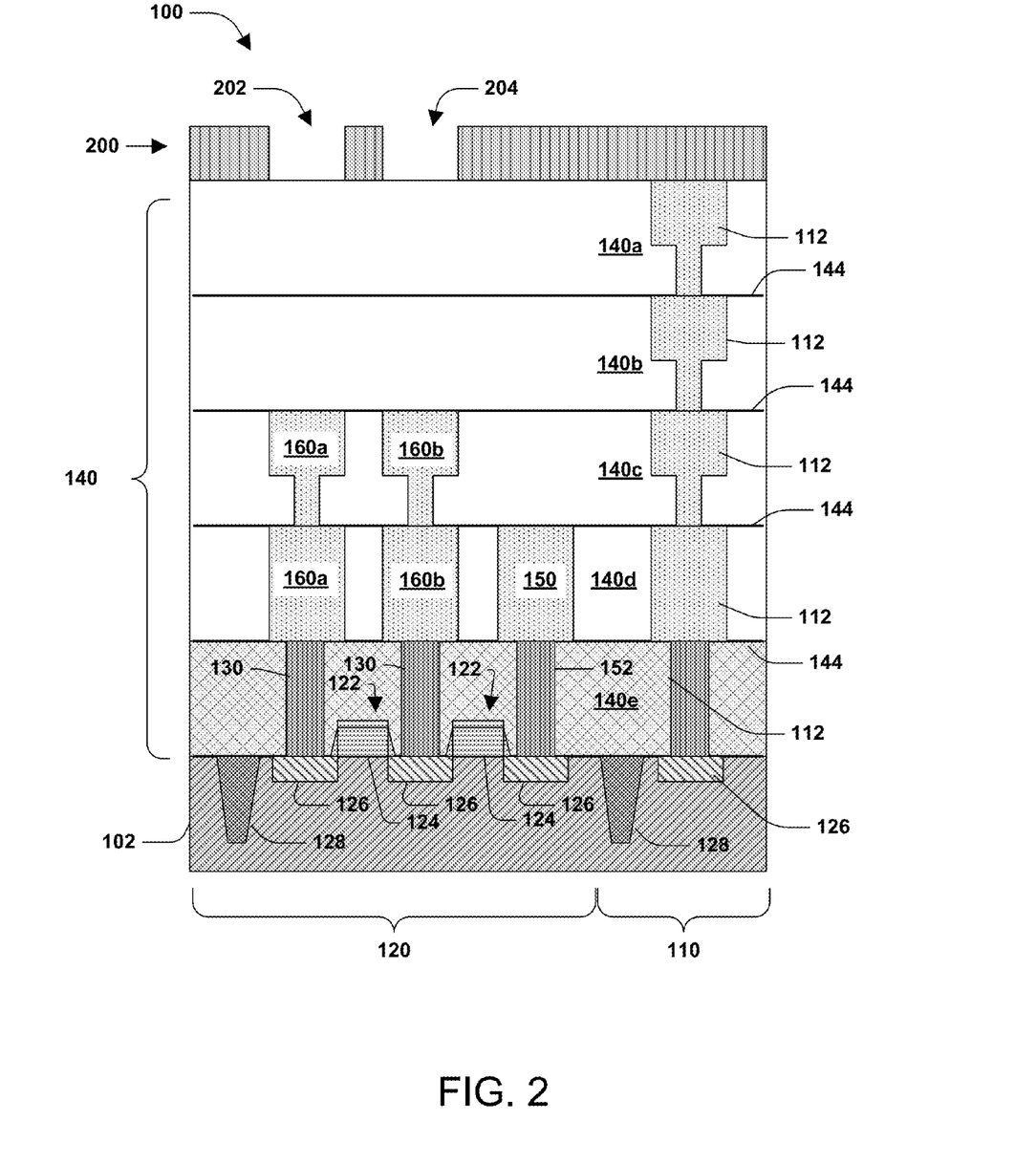
FIG. 2 illustrates a portion of a semiconductor arrangement, according to an embodiment.

Turning to FIG. 2, according to some embodiments, a first mask layer 200 is formed over the first dielectric layer 140a. In some embodiments, the first mask layer 200 covers the logic region 110 and portions of the active region 120. The first mask layer 200 is formed in any number of ways, such as by deposition, chemical vapor deposition (CVD), or other suitable methods, for example. The first mask layer 200 comprises any number of materials, including oxides, silicon oxide, nitrides, silicon nitride, $Si_3N_4$, etc., alone or in combination.

In some embodiments, the first mask layer 200 is patterned, such as via etching, to form a first mask opening 202 and a second mask opening 204. In an embodiment, the first mask opening 202 is formed over the first metal contacts 160a. In some embodiments, the second mask opening 204 is formed over the second metal contacts 160b.

Figure 3:
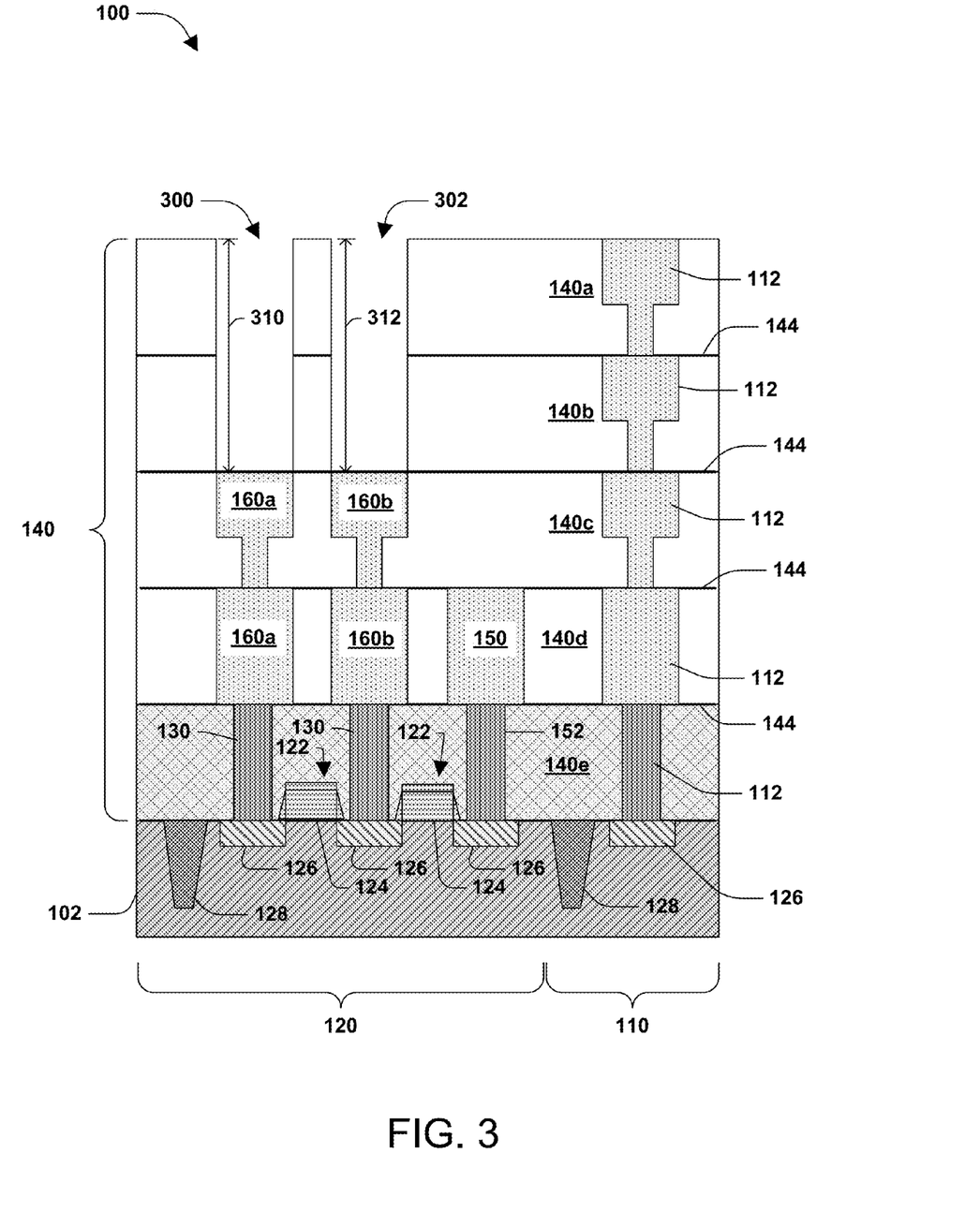
FIG. 3 illustrates a portion of a semiconductor arrangement, according to an embodiment.

Turning to FIG. 3, according to some embodiments, a first opening 300 and a second opening 302 are formed in at least some of the dielectric layers 140. The first opening 300 and second opening 302 are formed in any number of ways, such as by patterning and etching the first dielectric layer 140a and second dielectric layer 140b. According to some embodiments, an etch chemistry for etching through at least one of the first dielectric layer 140a and second dielectric layer 140b comprises $C_5F_8$, $C_4F_6$, $N_2$, Ar, etc., alone or in combination. In some embodiments, an etch time for etching through at least one of the first dielectric layer 140a or second dielectric layer 140b is about 3 minutes to about 5 minutes. In some embodiments, an etch chemistry for etching through the etch stop layer 144 between the first dielectric layer 140a and second dielectric layer 140b comprises $CF_4$, $N_2$, Ar, etc., alone or in combination.

In some embodiments, a first depth 310 of the first opening 300 is controlled by a timed etch, endpoint detection process, etc., alone or in combination. In some embodiments, the first depth 310 is between about 250 nm to about 1200 nm. In some embodiments, a second depth 312 of the second opening 302 is controlled by a timed etch, endpoint detection process, etc., alone or in combination. In some embodiments, the second depth 312 is between about 250 nm to about 1200 nm.

Figure 4:
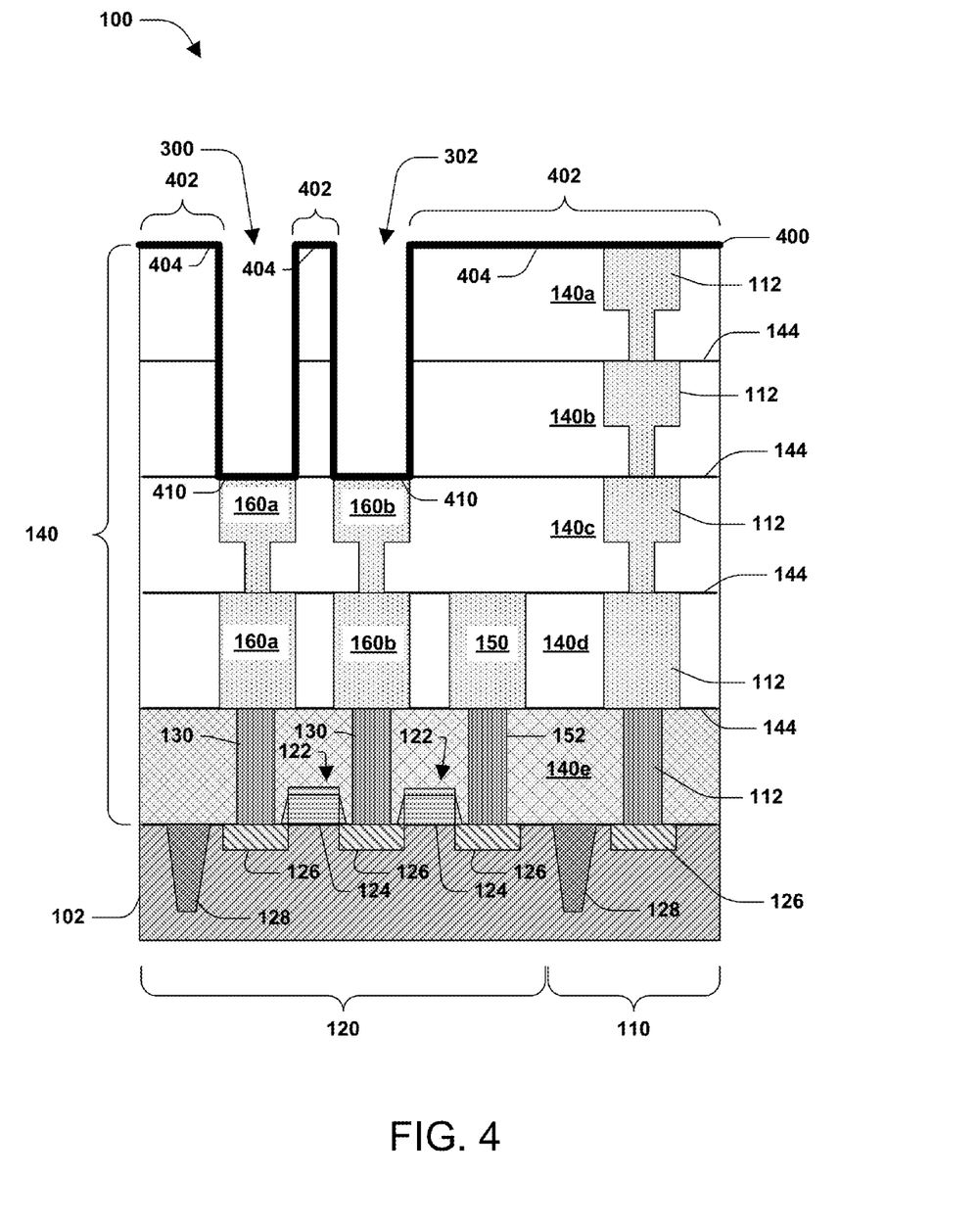
FIG. 4 illustrates a portion of a semiconductor arrangement, according to an embodiment.

Turning to FIG. 4, according to some embodiments, a first electrode layer 400 is formed within the first opening 300 and second opening 302 and over the first dielectric layer 140a. The first electrode layer 400 is formed in any number of ways, such as by atomic layer deposition (ALD), sputtering, thermal evaporation, chemical vapor deposition (CVD), etc., for example. According to some embodiments, a surface portion 400 of the first electrode layer 400 is formed over a top surface 404 of the first dielectric layer 140a. In some embodiments, the first electrode layer 400 comprises a conductive material, such as Ti, TiN, Ta, TaN, TaC, W, Ir, Ru, Pt, aluminum, copper, polysilicon, etc., alone or in combination. In an embodiment, the first electrode layer 400 is electrically connected to the first metal contacts 160a and second metal contacts 160b.

In some embodiments, the first electrode layer 400 comprises a bottom surface 410 at a bottom of the first opening 300 and second opening 302. According to some embodiments, at least three dielectric layers 140 are between the bottom surface 410 and the active region 120. In an embodiment, the at least three dielectric layers 140 between the bottom surface 410 and the active region 120 comprise the third dielectric layer 140c, the fourth dielectric layer 140d, and the fifth dielectric layer 140e. According to some embodiments, at least one dielectric layer 140 is between the bottom surface 410 and the bit line 150 disposed above the active region 120. In an embodiment, the at least one dielectric layer 140 between the bottom surface 410 and the bit line 150 comprises the third dielectric layer 140c.

Figure 5:
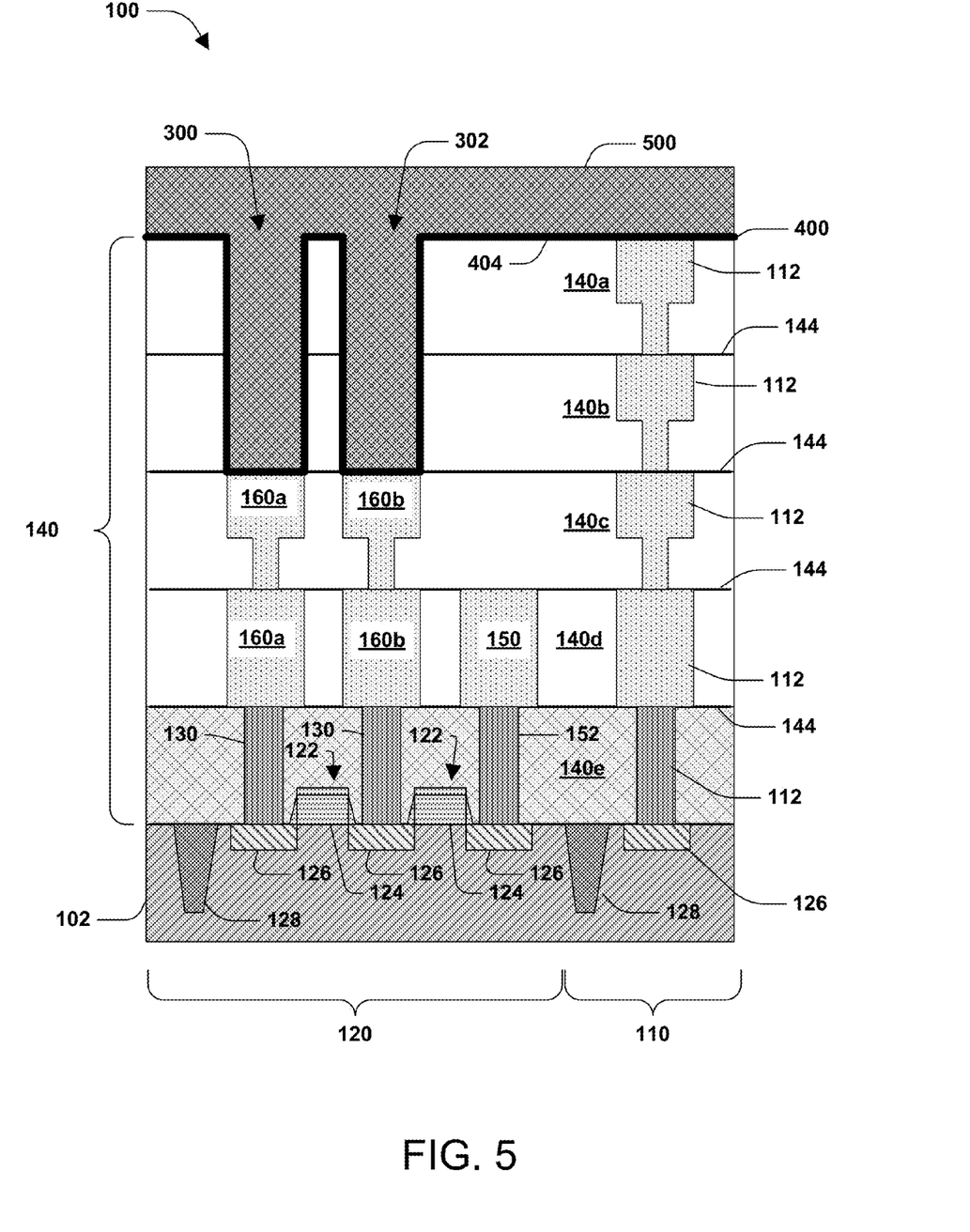
FIG. 5 illustrates a portion of a semiconductor arrangement, according to an embodiment.

Turning to FIG. 5, in some embodiments, a bottom anti-reflective coating (BARC) layer 500 is formed over the first electrode layer 400. The BARC layer 500 comprises any number of materials, including silicon, SiOC, other semiconductor materials, etc. In some embodiments, the BARC layer 500 is formed within the first opening 300 and second opening 302.

Figure 6:
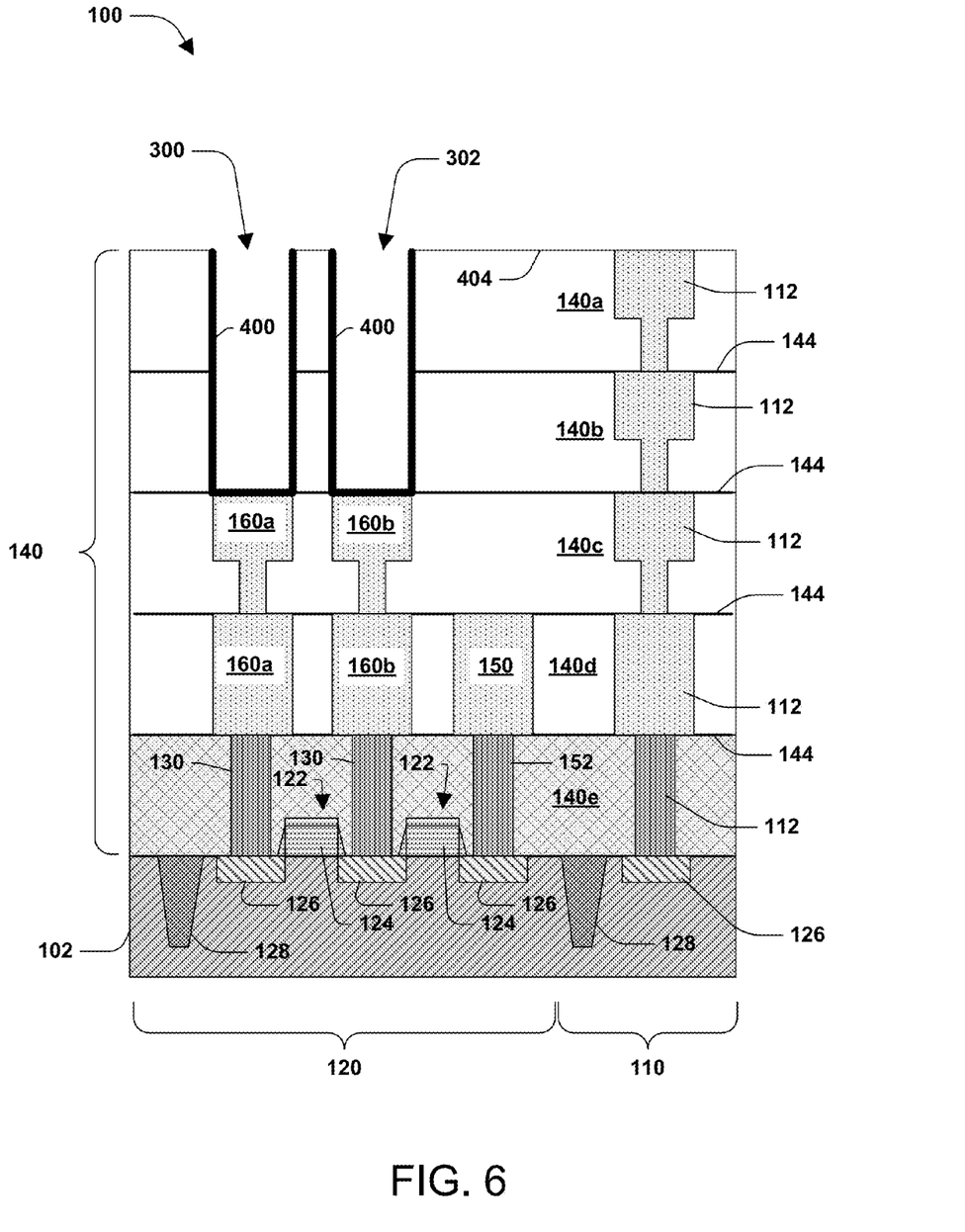
FIG. 6 illustrates a portion of a semiconductor arrangement, according to an embodiment.

Turning to FIG. 6, in some embodiments, the BARC layer 500 and the surface portion 402 of the first electrode layer 400 are removed, such as by wet etching, dry etching, etc. In some embodiments, an etch chemistry for etching through and removing the BARC layer 500 from the first electrode layer 400 comprises $CF_4$, $CHF_3$, $CH_2F_2$, $SF_6$, $O_2$, $N_2$, Ar, He, $Cl_2$, etc., alone or in combination. In some embodiments, a chemical mechanical polishing (CMP) process is used to remove at least some of the BARC layer 500 and the surface portions 402 (illustrated in FIG. 4) of the first electrode layer 400. In some embodiments, the BARC layer 500 (illustrated in FIG. 5) is formed over the first electrode layer 400 before removing the surface portion 402 of the first electrode layer 400.

Figure 7:
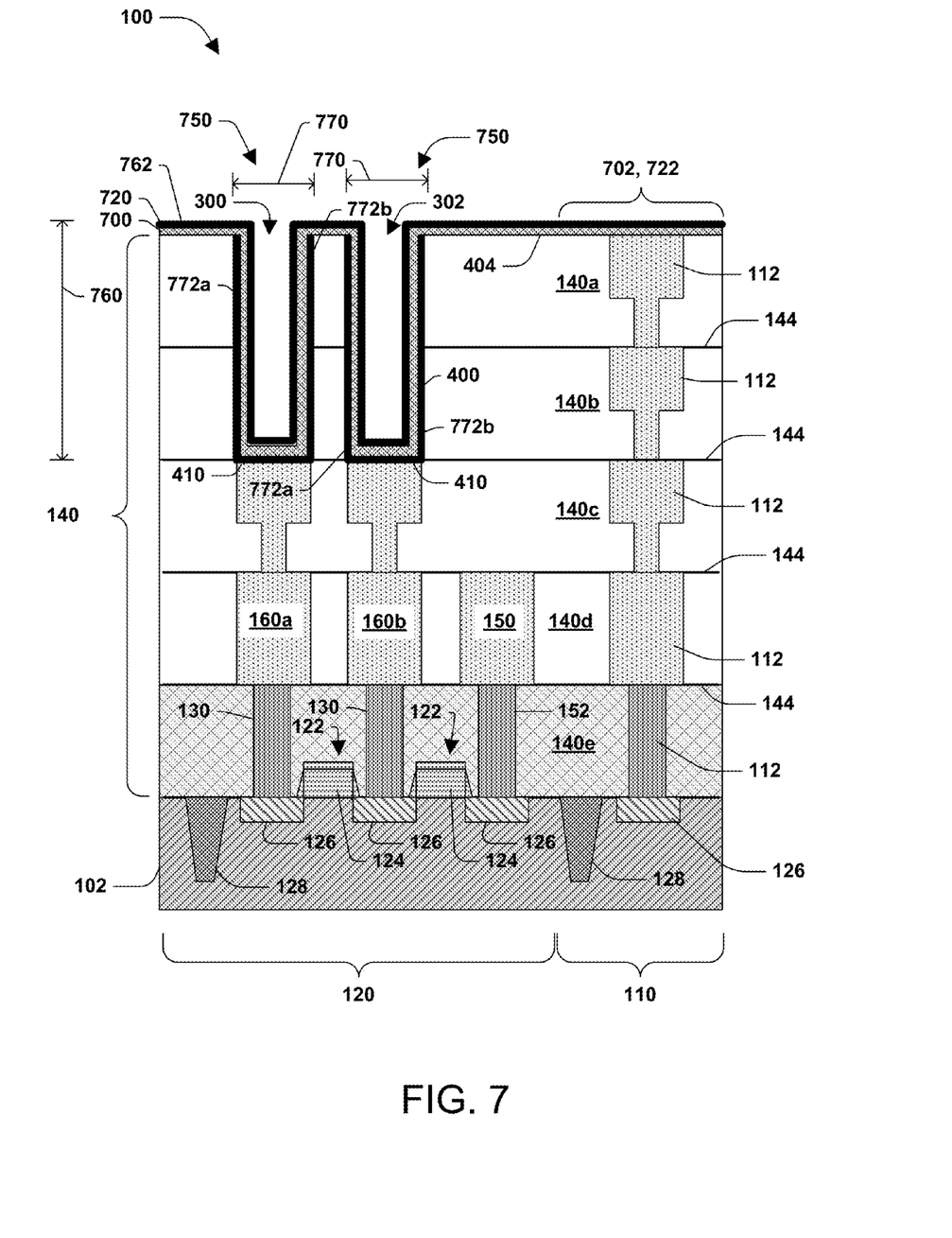
FIG. 7 illustrates a portion of a semiconductor arrangement, according to an embodiment.

Turning to FIG. 7, in some embodiments, an insulating layer 700 is formed on the first electrode layer 400 and on the top surface 404 of the first dielectric layer 140a. In some embodiments, the insulating layer 700 comprises a dielectric material with a relatively high dielectric constant. In some embodiments, the insulating layer 700 comprises a standard dielectric material with a medium or low dielectric constant, such as $SiO_2$. The insulating layer 700 is formed in any number of ways, such as by thermal growth, chemical growth, atomic layer deposition (ALD), chemical vapor deposition (CVD), plasma-enhanced chemical vapor deposition (PECVD), etc. In some embodiments, an insulating surface portion 702 is formed over the top surface 404 of the first dielectric layer 140a.

According to some embodiments, a second electrode layer 720 is formed within the first opening 300 and second opening 302 and over the insulating layer 700. While two electrode layers 400, 720 are illustrated, any number of electrode layers are contemplated. The second electrode layer 720 is formed in any number of ways, such as by atomic layer deposition (ALD), sputtering, thermal evaporation, chemical vapor deposition (CVD), etc., for example. In some embodiments, the second electrode layer 720 comprises a conductive material, such as Ti, TiN, Ta, TaN, TaC, W, Ir, Ru, Pt, aluminum, copper, polysilicon, etc., alone or in combination. In some embodiments, an electrode surface portion 722 is formed over the insulating surface portion 702 of the insulating layer 700 and over the top surface 404. According to some embodiments, the insulating layer 700 is between the first electrode layer 400 and the second electrode layer 720.

In some embodiments, a capacitor 750 is comprised of the first electrode layer 400, insulating layer 700, and second electrode layer. While two capacitors 750 are illustrated, any number of capacitors 750 are contemplated. In some embodiments, the capacitor 750 extends between 2 dielectric layers 140 to 10 dielectric layers 140. In some embodiments, a height 760 of the capacitor 750 is measured from the bottom surface 410 of the first electrode layer 400 to a top surface 762 of the second electrode layer 720. In some embodiments, the height 760 of the capacitor 750 is between about 250 nm to about 1200 nm.

In some embodiments, a width 770 of the capacitor 750 is measured between opposing side surfaces 772a, 772b of the second electrode layer 720. In some embodiments, the width 770 of the capacitor 750 is between about 30 nm to about 200 nm. According to some embodiments, an aspect ratio of the capacitor 750 represents the height 760 of the capacitor 750 to the width 770 of the capacitor 750. In some embodiments, the aspect ratio of the capacitor 750 is between about 5 to about 25.

Figure 8:
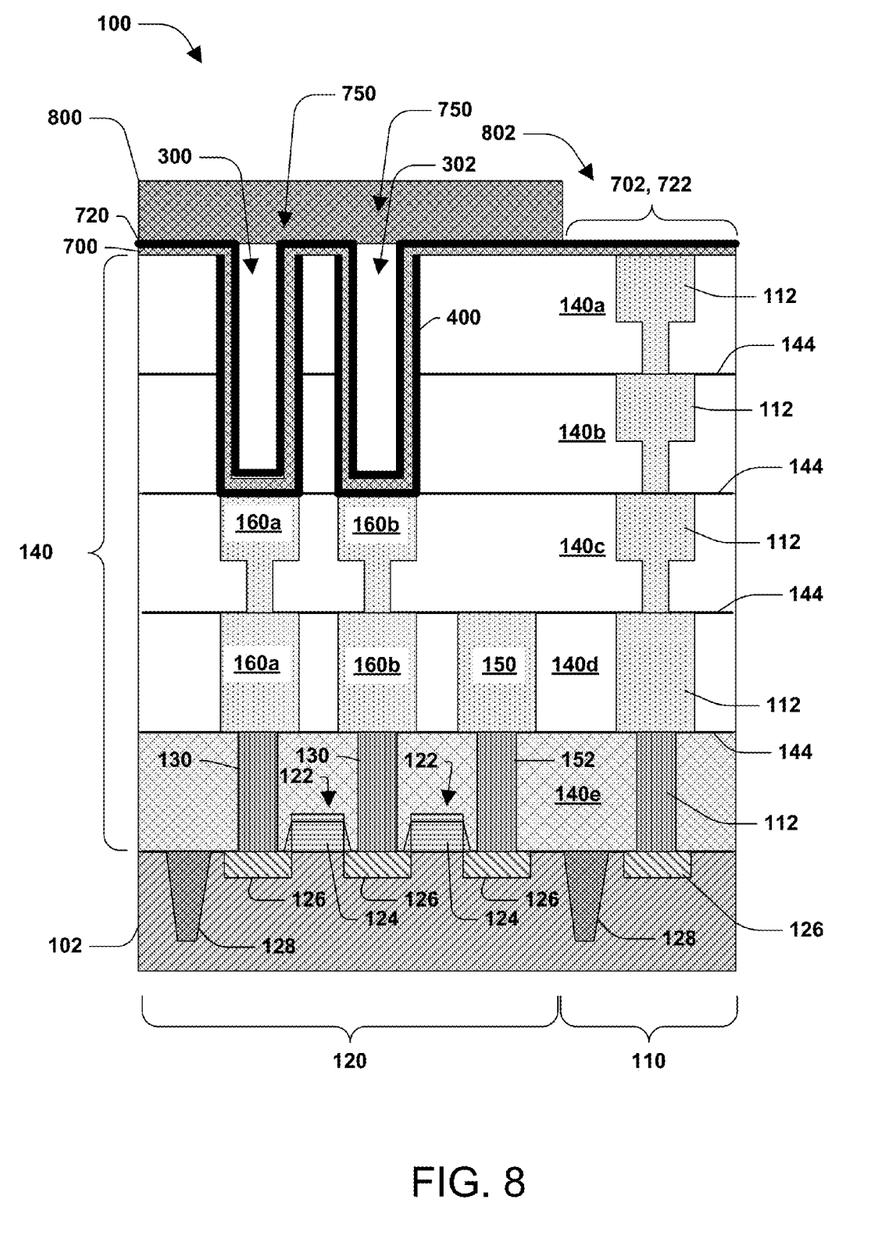
FIG. 8 illustrates a portion of a semiconductor arrangement, according to an embodiment.

Turning to FIG. 8, according to some embodiments, a second mask layer 800 is formed over the second electrode layer 720 of the capacitor 750. In some embodiments, the second mask layer 800 covers the active region 120. The second mask layer 800 is formed in any number of ways, such as by deposition, chemical vapor deposition (CVD), or other suitable methods, for example. The second mask layer 800 comprises any number of materials, including oxides, silicon oxide, nitrides, silicon nitride, $Si_3N_4$, etc., alone or in combination.

In some embodiments, the second mask layer 800 is patterned and etched to form a second mask opening 802. In an embodiment, the second mask opening 802 is formed over the electrode surface portion 722 of the second electrode layer 720 and over the insulating surface portion 702 of the insulating layer 700.

Figure 9:
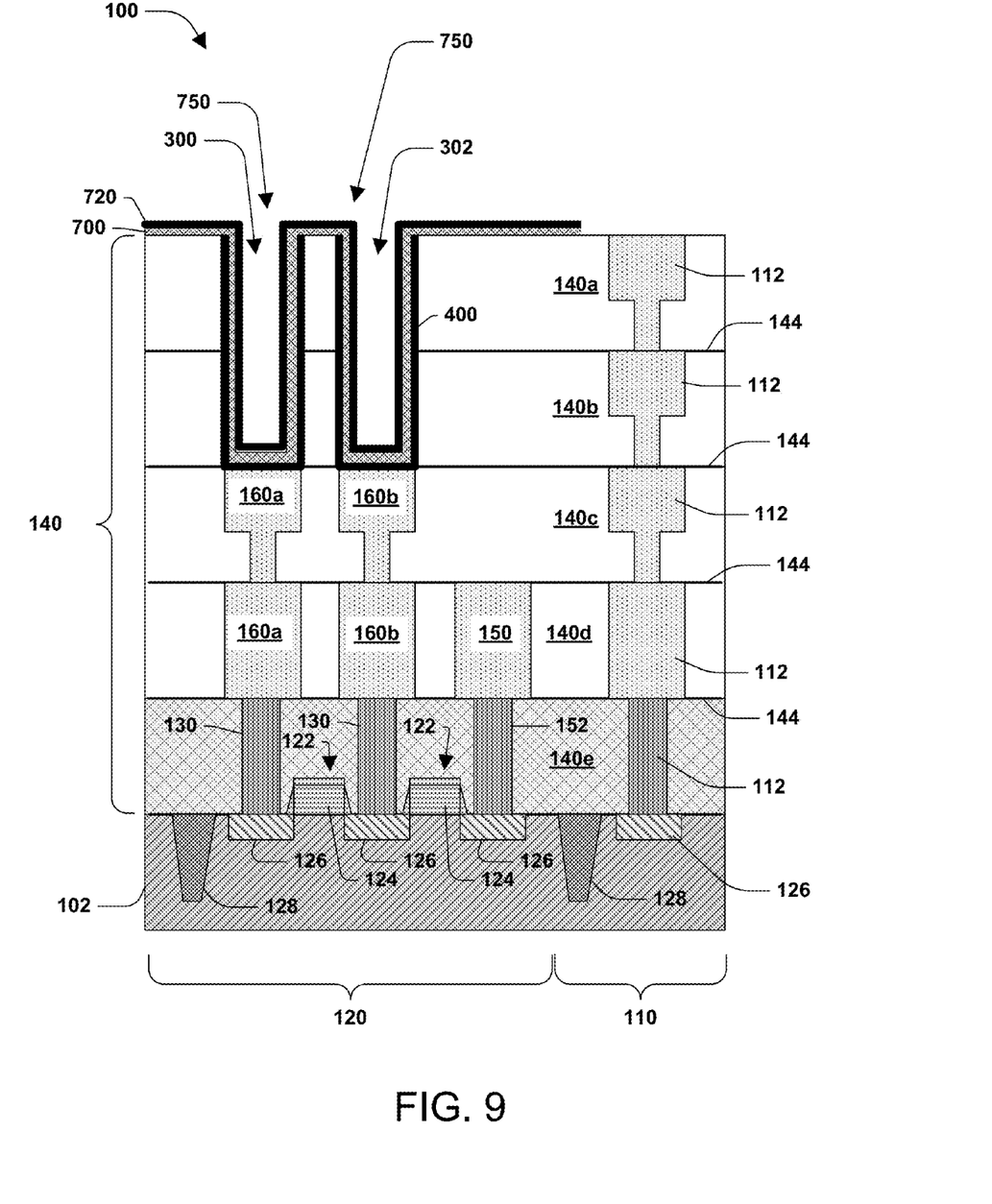
FIG. 9 illustrates a portion of a semiconductor arrangement, according to an embodiment.

Turning to FIG. 9, according to some embodiments, the second mask layer 800, the electrode surface portion 722 of the second electrode layer 720, and the insulating surface portion 702 of the insulating layer 700 are removed, such as by wet etching, dry etching, etc. In some embodiments, an etch chemistry for removing at least one of the electrode surface portion 722 or the insulating surface portion 702 is selective enough so as to not remove the first dielectric layer 140a or the logic contacts 112.

Figure 10:
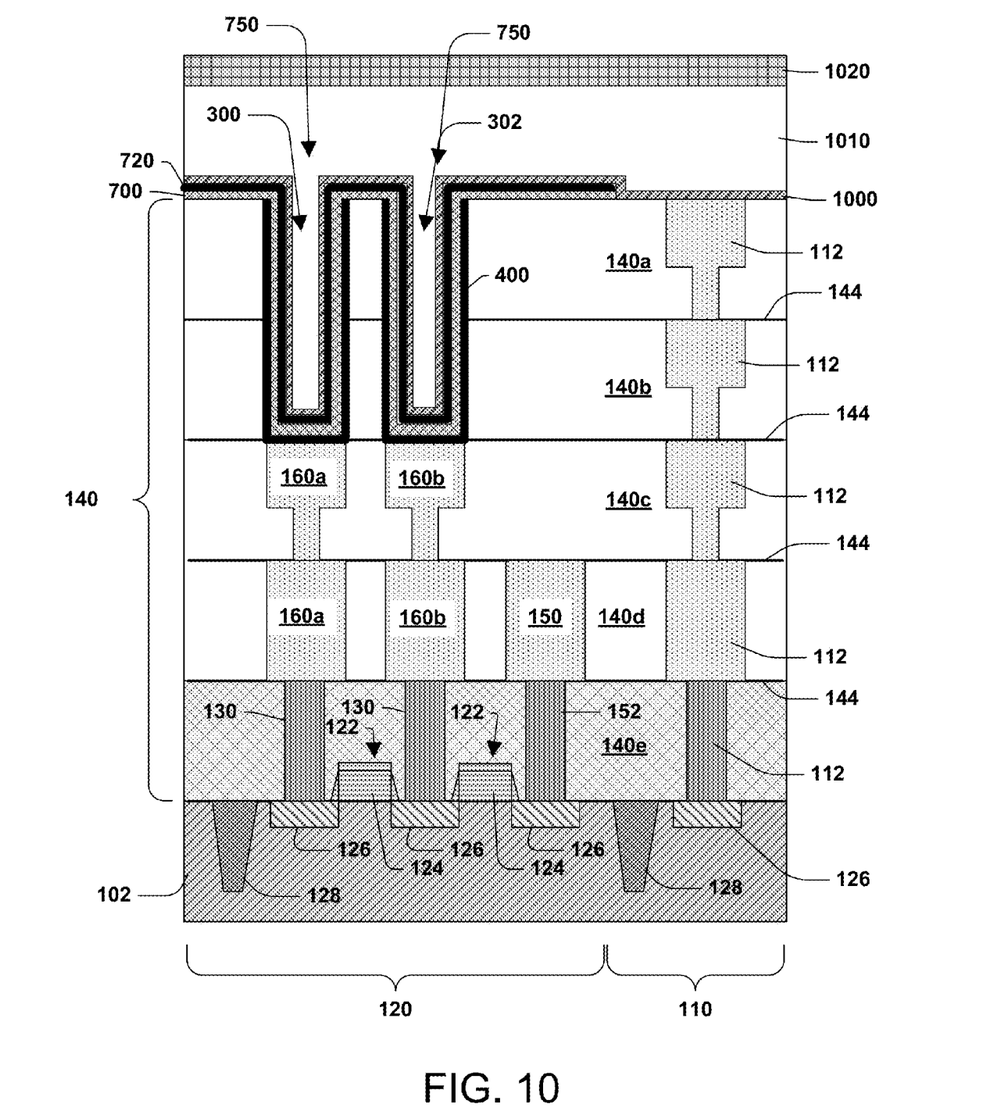
FIG. 10 illustrates a portion of a semiconductor arrangement, according to an embodiment.

Turning to FIG. 10, according to some embodiments, an etch stop layer 1000 is formed over the second electrode layer 720 and the first dielectric layer 140a. In some embodiments, the etch stop layer 1000 comprises SiN, SiCN, SiCO, CN, etc., alone or in combination. The etch stop layer 1000 is formed in any number of ways, such as by thermal growth, chemical growth, atomic layer deposition (ALD), chemical vapor deposition (CVD), plasma-enhanced chemical vapor deposition (PECVD), etc.

According to some embodiments, a dielectric layer 1010 is formed over the etch stop layer 1000 and over the second electrode layer 720 of the capacitor 750. In an embodiment, the dielectric layer 1010 comprises a standard dielectric material with a medium or low dielectric constant, such as $SiO_2$. In some embodiments, the dielectric layer 1010 comprises a dielectric material with a relatively high dielectric constant. The dielectric layer 1010 is formed in any number of ways, such as by thermal growth, chemical growth, atomic layer deposition (ALD), chemical vapor deposition (CVD), plasma-enhanced chemical vapor deposition (PECVD), etc. According to some embodiments, between 1 dielectric layer 1010 to 5 dielectric layers 1010 are above the capacitor 750.

According to some embodiments, a BARC layer 1020 is formed over the dielectric layer 1010. The BARC layer 1020 comprises any number of materials, including silicon, SiOC, other semiconductor materials, etc.

Figure 11:
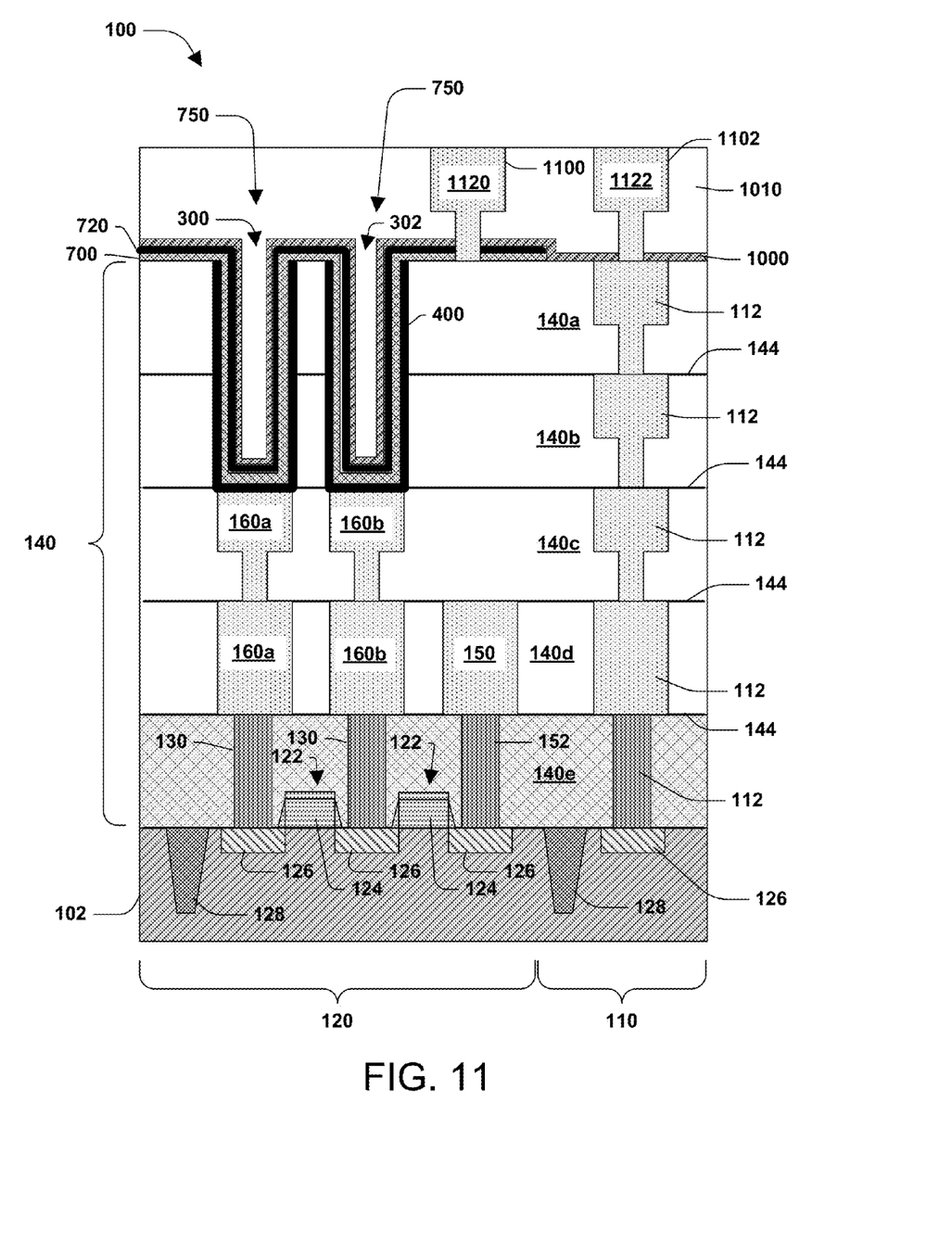
FIG. 11 illustrates a portion of a semiconductor arrangement, according to an embodiment.

Turning to FIG. 11, according to some embodiments, the BARC layer 1020 is removed, such as by wet etching, dry etching, etc. In some embodiments, after the BARC layer 1020 is removed, a first opening 1100 and a second opening 1102 are formed in the dielectric layer 1010 and the etch stop layer 1000.

According to some embodiments, a pick up contact 1120 is formed in the first opening 1100. In an embodiment, the pick up contact 1120 extends through the dielectric layer 1010 and the etch stop layer 1000. In some embodiments, the pick up contact 1120 is in contact with the insulating layer 700 and the second electrode layer 720. The pick up contact 1120 is formed in any number of ways, such as by a single damascene process, dual damascene process, etc.

According to some embodiments, a via contact 1122 is formed in the second opening 1102. In an embodiment, the via contact 1122 extends through the dielectric layer 1010 and the etch stop layer 1000. In some embodiments, the via contact 1122 is in contact with the logic contact 112. The via contact 1122 is formed in any number of ways, such as by a single damascene process, dual damascene process, etc.

Figure 12:
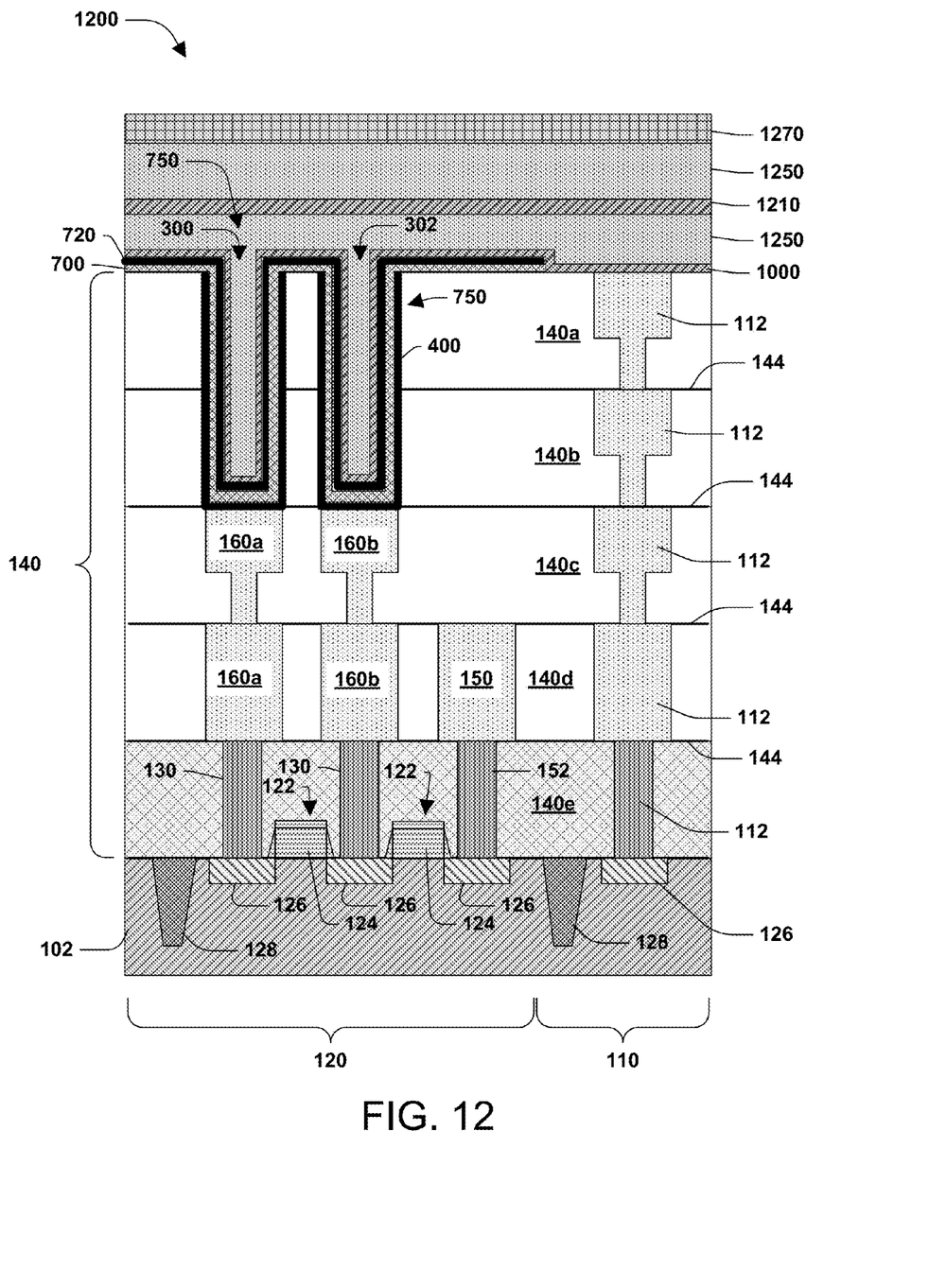
FIG. 12 illustrates a portion of a semiconductor arrangement, according to an embodiment.

FIG. 12 illustrates a second example semiconductor arrangement 1200. According to some embodiments, the second semiconductor arrangement 1200 comprises the logic region 110, active region 120, semiconductor device 122, dielectric layers 140, capacitor 750, etc.

According to some embodiments, after the second mask layer 800, the electrode surface portion 722 of the second electrode layer 720, and the insulating surface portion 702 of the insulating layer 700 are removed, as illustrated in FIG. 9, etch stop layers 1000, 1210 and oxide layers 1250 are formed. In some embodiments, the etch stop layer 1000 is formed over the second electrode layer 720 and the first dielectric layer 140a. In some embodiments, the etch stop layers 1000, 1210 comprise a dielectric material having a different etch selectivity from the first dielectric layer 140a. In some embodiments, the etch stop layers 1000, 1210 comprise SiN, SiCN, SiCO, CN, etc., alone or in combination. The etch stop layers 1000, 1210 are formed in any number of ways, such as by thermal growth, chemical growth, atomic layer deposition (ALD), chemical vapor deposition (CVD), plasma-enhanced chemical vapor deposition (PECVD), etc.

In some embodiments, at least one oxide layer 1250 is formed between the etch stop layers 1000, 1210 and above the second electrode layer 720 of the capacitor 750. In some embodiments, the oxide layers 1250 are formed in any number of ways, such as by deposition, chemical vapor deposition (CVD), or other suitable methods, for example. The oxide layers 1250 comprise any number of materials, including oxides, silicon oxide, nitrides, silicon nitride, oxynitrides, $SiO_2$, etc., alone or in combination.

According to some embodiments, a BARC layer 1270 is formed over the oxide layer 1250. The BARC layer 1270 comprises any number of materials, including silicon, SiOC, SiON, other semiconductor materials, etc.

Figure 13:
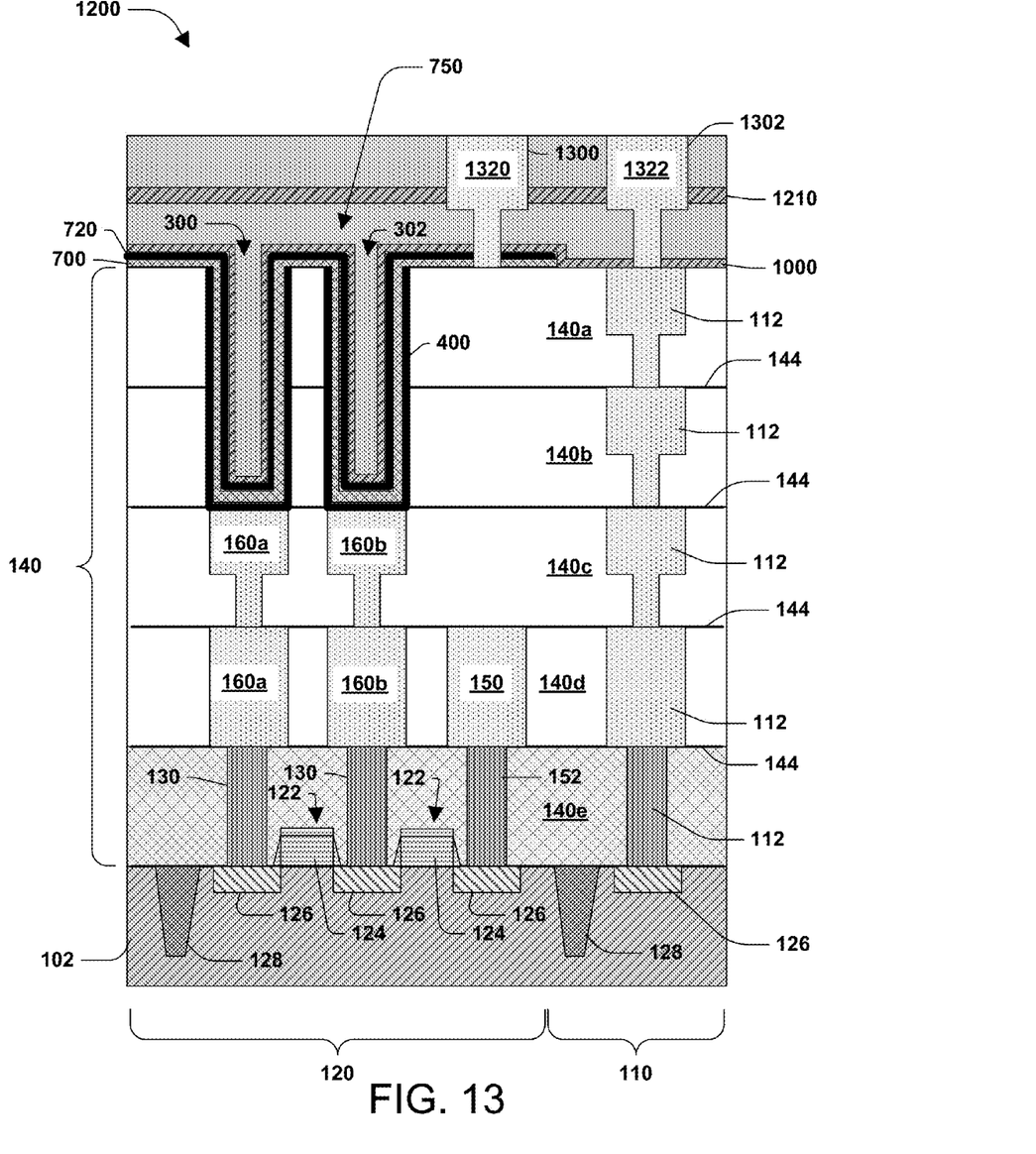
FIG. 13 illustrates a portion of a semiconductor arrangement, according to an embodiment.

Turning to FIG. 13, according to some embodiments, the BARC layer 1270 is removed, such as by wet etching, dry etching, etc. In some embodiments, after the BARC layer 1270 is removed, a first opening 1300 and a second opening 1302 are formed in the oxide layer 1250 and the etch stop layers 1000, 1210.

According to some embodiments, a pick up contact 1320 is formed in the first opening 1300. In an embodiment, the pick up contact 1320 extends through the oxide layer 1250 and the etch stop layers 1000, 1210. In some embodiments, the pick up contact 1320 is in contact with the insulating layer 700 and the second electrode layer 720. The pick up contact 1320 is formed in any number of ways, such as by a single damascene process, dual damascene process, etc.

According to some embodiments, a via contact 1322 is formed in the second opening 1302. In an embodiment, the via contact 1322 extends through the oxide layer 1250 and the etch stop layers 1000, 1210. In some embodiments, the via contact 1322 is in contact with the logic contact 112. The via contact 1322 is formed in any number of ways, such as by a single damascene process, dual damascene process, etc.

Figure 14:
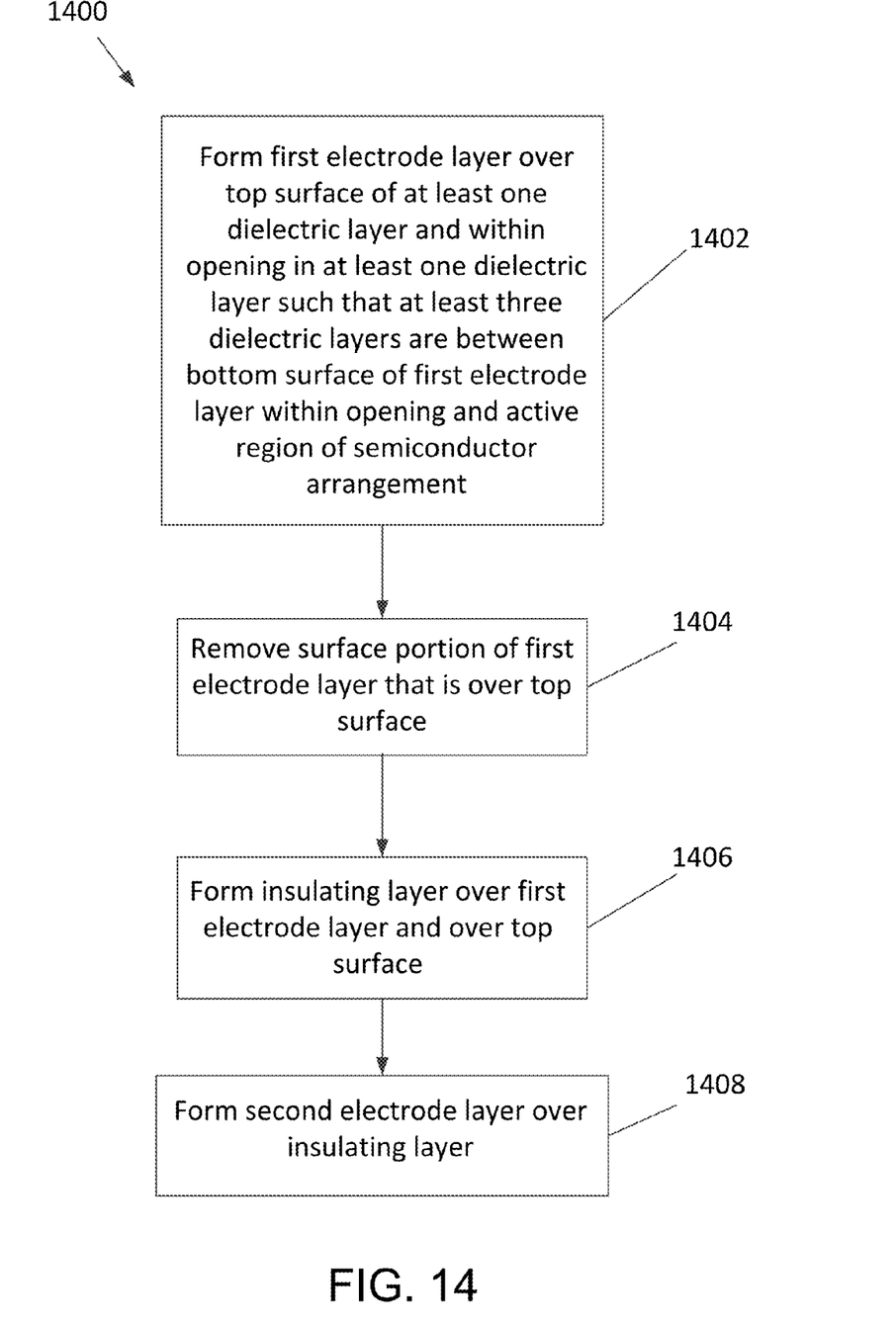
FIG. 14 illustrates a method of forming a semiconductor arrangement, according to an embodiment.

A method 1400 of forming a semiconductor arrangement, according to some embodiments, such as semiconductor arrangement 100, 1200, is illustrated in FIG. 14. At 1402, a first electrode layer 400 is formed over a top surface 404 of at least one dielectric layer 140 and within an opening 300, 302 in the at least one dielectric layer 140 such that at least three dielectric layers 140c, 140d, 140e are between a bottom surface 410 of the first electrode layer 400 within the opening 300, 302 and an active region 120 of the semiconductor arrangement 100, 1200. At 1404, a surface portion 402 of the first electrode layer 400 that is over the top surface 404 is removed. At 1406, an insulating layer 700 is formed over the first electrode layer 400 and over the top surface 404. At 1408, a second electrode layer 720 is formed over the insulating layer 700.

According to some embodiments, the semiconductor arrangement 100, 1200 comprises the capacitor 750, wherein at least three dielectric layers 140c, 140d, 140e are between the bottom surface 410 of the first electrode layer 400 and the active region 120 of the semiconductor arrangement 100, 1200. In some embodiments, the height of the bit line 150 with respect to the active region 120 is relatively low, such that the resistance ($R_b$) between the bit line 150 and the capacitor 750 is reduced. Likewise, parasitic capacitance ($C_b$) is also reduced.

In an embodiment, a semiconductor arrangement comprises an active region comprising a semiconductor device. In an embodiment, the semiconductor arrangement comprises a capacitor having a first electrode layer, a second electrode layer, and an insulating layer between the first electrode layer and the second electrode layer. In an embodiment, at least three dielectric layers are between a bottom surface of the capacitor and the active region In an embodiment, a semiconductor arrangement comprises an active region comprising a semiconductor device. In an embodiment, the semiconductor arrangement comprises a capacitor having a first electrode layer, a second electrode layer, and an insulating layer between the first electrode layer and the second electrode layer. In an embodiment, at least one dielectric layer is between a bottom surface of the capacitor and a bit line disposed above the active region. In an embodiment, an aspect ratio of a height of the capacitor to a width of the capacitor is between about 5 to about 25

In an embodiment, a method of forming a semiconductor arrangement comprises forming a first electrode layer over a top surface of at least one dielectric layer and within an opening in the at least one dielectric layer such that at least three dielectric layers are between a bottom surface of the first electrode layer within the opening and an active region of the semiconductor arrangement. In an embodiment, the method comprises removing a surface portion of the first electrode layer that is over the top surface. In an embodiment, the method comprises forming an insulating layer over the first electrode layer and over the top surface. In an embodiment, the method comprises forming a second electrode layer over the insulating layer.

Although the subject matter has been described in language specific to structural features or methodological acts, it is to be understood that the subject matter of the appended claims is not necessarily limited to the specific features or acts described above. Rather, the specific features and acts described above are disclosed as example forms of implementing at least some of the claims.

Various operations of embodiments are provided herein. The order in which some or all of the operations are described should not be construed to imply that these operations are necessarily order dependent. Alternative ordering will be appreciated having the benefit of this description. Further, it will be understood that not all operations are necessarily present in each embodiment provided herein. Also, it will be understood that not all operations are necessary in some embodiments.

It will be appreciated that layers, regions, features, elements, etc. depicted herein are illustrated with particular dimensions relative to one another, such as structural dimensions and/or orientations, for example, for purposes of simplicity and ease of understanding and that actual dimensions of the same differ substantially from that illustrated herein, in some embodiments. Additionally, a variety of techniques exist for forming the layers, regions, features, elements, etc. mentioned herein, such as implanting techniques, doping techniques, spin-on techniques, sputtering techniques, growth techniques, such as thermal growth and/or deposition techniques such as chemical vapor deposition (CVD), for example.

Moreover, "exemplary" is used herein to mean serving as an example, instance, illustration, etc., and not necessarily as advantageous. As used in this application, "or" is intended to mean an inclusive "or" rather than an exclusive "or". In addition, "a" and "an" as used in this application and the appended claims are generally be construed to mean "one or more" unless specified otherwise or clear from context to be directed to a singular form. Also, at least one of A and B and/or the like generally means A or B or both A and B. Furthermore, to the extent that "includes", "having", "has", "with", or variants thereof are used, such terms are intended to be inclusive in a manner similar to the term "comprising". Also, unless specified otherwise, "first," "second," or the like are not intended to imply a temporal aspect, a spatial aspect, an ordering, etc. Rather, such terms are merely used as identifiers, names, etc. for features, elements, items, etc. For example, a first region and a second region generally correspond to region A and region B or two different or two identical regions or the same type region.

Also, although the disclosure has been shown and described with respect to one or more implementations, equivalent alterations and modifications will occur to others skilled in the art based upon a reading and understanding of this specification and the annexed drawings. The disclosure comprises all such modifications and alterations and is limited only by the scope of the following claims. In particular regard to the various functions performed by the above described components (e.g., elements, resources, etc.), the terms used to describe such components are intended to correspond, unless otherwise indicated, to any component which performs the specified function (e.g., that is functionally equivalent), even though not structurally equivalent to the disclosed structure. In addition, while a particular feature of the disclosure may have been disclosed with respect to only one of several implementations, such feature may be combined with one or more other features of the other implementations as may be desired and advantageous for any given or particular application.

What is claimed is:

1. A semiconductor arrangement comprising:
    an active region comprising a semiconductor device;
    a first dielectric layer overlying the active region;
    a second dielectric layer overlying the active region and in direct contact with the first dielectric layer; and
    a capacitor extending through the first dielectric layer and the second dielectric layer, the capacitor having a first electrode layer, a second electrode layer, and an insulating layer between the first electrode layer and the second electrode layer, wherein at least three additional dielectric layers are between a bottom surface of the capacitor and the active region.

2. The semiconductor arrangement of claim 1, wherein at least one dielectric layer of the additional dielectric layers is between the bottom surface of the capacitor and a bit line disposed above the active region.

3. The semiconductor arrangement of claim 1, wherein an aspect ratio of a height of the capacitor to a width of the capacitor is between about 5 to about 25.

4. The semiconductor arrangement of claim 1, wherein a height of the capacitor is between about 250 nm to about 1200 nm.

5. The semiconductor arrangement of claim 1, wherein a width of the capacitor is between about 30 nm to about 200 nm.

6. The semiconductor arrangement of claim 1, comprising a conformal etch stop layer in contact with the second electrode layer.

7. The semiconductor arrangement of claim 1, wherein between 1 dielectric layer to 5 dielectric layers are above the capacitor.

8. The semiconductor arrangement of claim 1, wherein at least one oxide layer is above the capacitor.

9. A semiconductor arrangement comprising:
    an active region comprising a first semiconductor device and a second semiconductor device that share a source/drain region; and
    a capacitor coupled to the source/drain region and having a first electrode layer, a second electrode layer, and an insulating layer between the first electrode layer and the second electrode layer, at least one dielectric layer between a bottom surface of the capacitor and a bit line disposed above the active region.

10. The semiconductor arrangement of claim 9, wherein at least three dielectric layers are between the bottom surface of the capacitor and the active region.

11. The semiconductor arrangement of claim 9, wherein a height of the capacitor is between about 250 nm to about 1200 nm.

12. The semiconductor arrangement of claim 9, wherein a width of the capacitor is between about 30 nm to about 200 nm.

13. The semiconductor arrangement of claim 9, wherein the capacitor extends between 2 dielectric layers to 10 dielectric layers.

14. The semiconductor arrangement of claim 9, wherein the capacitor overlies the source/drain region.

15. The semiconductor arrangement of claim 9, wherein at least one oxide layer is above the capacitor.

16. A semiconductor arrangement comprising:
    an active region comprising a semiconductor device, the semiconductor device comprising:
        a source/drain region; and
        a gate region;
    a capacitor having a first electrode layer, a second electrode layer, and an insulating layer between the first electrode layer and the second electrode layer, the first electrode layer electrically coupled to the source/drain region; and
    a conformal etch stop layer in contact with the second electrode layer, wherein the conformal etch stop layer has a uniform thickness.

17. The semiconductor arrangement of claim 16, comprising:
    a first dielectric layer over the source/drain region;
    a first etch stop layer over the first dielectric layer; and
    a second dielectric layer over the first etch stop layer.

18. The semiconductor arrangement of claim 17, wherein a bottom surface of the first electrode layer is above the second dielectric layer.

19. The semiconductor arrangement of claim 17, comprising:
    a second etch stop layer over the second dielectric layer; and
    a third dielectric layer over the second etch stop layer, the first electrode layer extending through the third dielectric layer.

20. The semiconductor arrangement of claim 17, comprising a metal contact extending through the second dielectric layer and in contact with the first electrode layer.

* * * * *